United States Patent [19]
Yu et al.

[11] Patent Number: 5,937,269
[45] Date of Patent: Aug. 10, 1999

[54] GRAPHICS ASSISTED MANUFACTURING PROCESS FOR THIN-FILM DEVICES

[75] Inventors: Roy Yu, Poughkeepsie, N.Y.; Gerald K. Bartley, Rochester, Minn.; Peter A. Franklin, Marlboro, N.Y.; Carmine J. Mele, Gardiner, N.Y.; Arthur G. Merryman, Hopewell Junction, N.Y.; John R. Pennacchia, Wappingers Falls, N.Y.; Kurt A. Smith, Poughkeepsie, N.Y.; Thomas A. Wassick, Lagrangeville, N.Y.; Thomas A. Wayson, Owego, N.Y.

[73] Assignee: International Business Machines Corporation, Armonk, N.Y.

[21] Appl. No.: 08/960,695

[22] Filed: Oct. 29, 1997

Related U.S. Application Data

[63] Continuation-in-part of application No. 08/955,204.

[51] Int. Cl.⁶ .................................................. H01L 21/00
[52] U.S. Cl. ................................ 438/4; 438/15; 438/17; 438/18
[58] Field of Search ................................ 438/14, 17, 18, 438/4; 427/8, 96; 324/765

[56] References Cited

U.S. PATENT DOCUMENTS

| | | |
|---|---|---|
| 4,261,800 | 4/1981 | Beckenbaugh et al. . |
| 4,624,749 | 11/1986 | Black et al. . |
| 4,919,971 | 4/1990 | Chen . |
| 4,931,353 | 6/1990 | Tanielian . |
| 4,994,154 | 2/1991 | Chen et al. . |
| 5,141,602 | 8/1992 | Chen et al. . |
| 5,144,747 | 9/1992 | Eichelberger . |
| 5,145,714 | 9/1992 | Reisman et al. . |
| 5,182,230 | 1/1993 | Donelon et al. . |
| 5,250,843 | 10/1993 | Eichelberger . |
| 5,368,711 | 11/1994 | Poris . |
| 5,392,222 | 2/1995 | Noble ........................................ 364/490 |
| 5,530,372 | 6/1996 | Lee et al. .................................. 364/758 |
| 5,568,682 | 10/1996 | Gates, Jr. et al. . |
| 5,747,095 | 5/1998 | McAllister et al. ......................... 427/8 |
| 5,818,239 | 10/1998 | Scaman .................................... 324/537 |

OTHER PUBLICATIONS

S. Mutnick, "Repairing Breaks in Printed Circuits", IBM Technical Disclosure Bulletin, vol. 8, No. 11, Apr. 1966.

"Laser Deposition of Metal Films With Organo–Metal Ink", IBM Technical Disclosure Bulletin, vol. 31, No. 7, Dec. 1988, pp. 45–46.

"Localized Laser Deposition of Gold From Solid Salts", Research Disclosure, Kenneth Mason Publications Ltd., England, No. 293, Sep. 1988.

F.M. Tappen, "Open Conductor Repair For Glass Metal Module", IBM Technical Disclosure Bulletin, vol. 14, No. 10, Mar. 1972, p. 2915.

"Method for Repairing Defective Electrical Connections on Multi–Layer Thin Film (MLTF) Electronic Packages and the Resulting MLTF Structure," is the subject of U.S. application No. 08/577,677, filed on Dec. 21, 1995.

*Primary Examiner*—John F. Niebling
*Assistant Examiner*—John Murphy
*Attorney, Agent, or Firm*—Ratner & Prestia

[57] ABSTRACT

A Process for graphically assisting the partial repair of defective MCM TF wiring nets. The process comprises the steps of inserting the wiring layer of the thin-film device in a tester, scanning the wiring layer of the thin-film device with the tester, identifying defects in the wiring nets, prioritizing the defects based on a function of each of the defective wiring nets, and repairing the defects based on priority.

20 Claims, 12 Drawing Sheets

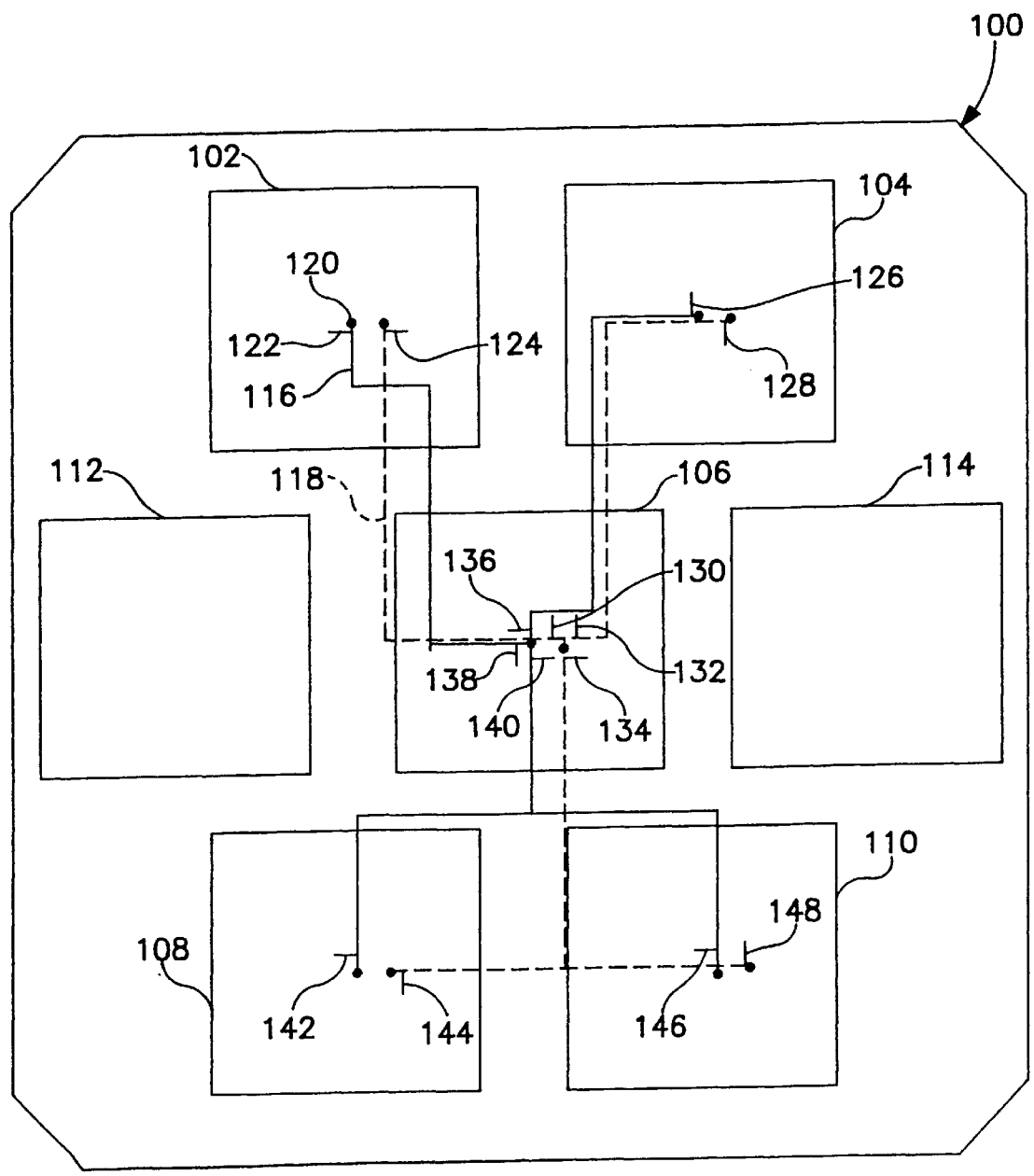
FIG. I
PRIOR ART

GRAPHICS ASSISTED MANUFACTURING PROCESS FOR THIN-FILM DEVICES

RELATED APPLICATIONS

This application is a continuation in part of copending U.S. application Ser. No. 08/955,204 pending which is entitled "Enhanced Thin Film Wiring Net Repair Process", assigned to the present assignee, and which is incorporated by reference in its entirety.

FIELD OF THE INVENTION

The present invention generally relates to thin-film repair and, more particularly, to the partial repair of thin-film wiring nets using graphical assistance.

BACKGROUND OF THE INVENTION

Conventionally, there are two stages of repair for Multi-Chip thin-film (MCM TF) modules: 1) in-line repair and 2) after thin-film (ATF) repair.

During the construction of each metal layer of an MCM TF module (there are 4 to 6 metal layers for typical plane pair wiring), each metal wiring layer is scanned with an optical robot to inspect the structural integrity of the layers. Open circuits or shorts between wiring nets are identified and the defects are repaired. A conventional repair of a short circuit uses a laser beam to remove the shorts between two wiring nets. When a wiring net has missing metal (an open), a gold slug is placed on the open area and is ultrasonically bonded to bridge the open. This type of in-line open/short repair is performed based on the physical layout of the structure. In-line testing is also performed on each metal layer, especially at the x and y plane pair levels, to further isolate defects.

After the entire TF module is completed, a full electrical test, an ATF test, is performed to confirm the integrity of the completed wiring. If any defect is detected at this stage, an ATF repair using top-surface repair lines is performed to correct the defective nets. FIG. 1 shows a plan view of a typical MCM 100. In FIG. 1, chips 102, 104, 106, 108, 110, 112, and 114 are mounted to the top surface metallurgy (TSM) of MCM 100 at Controlled-Collapsed-Chip-Connection (C4) locations (not shown in this Figure). In FIG. 1 seven chip locations are shown. MCMs are not limited to this configuration, however, and may be any number of chips depending on the requirements of the application. Before mounting the chips 102 through 114, MCM 100 is tested to ensure that no open circuits or short circuits exist in MCM 100. If open circuits or short circuits are found, the MCM must be repaired.

The conventional ATF repair strategy discards the entire original net wiring and reconstructs new net wiring using the top surface repair lines, modifying their lengths to match the required electrical properties of the deleted wiring net. This combination of in-line and ATF repair has worked well for traditional MCM-TF manufacturing. For tight ground rule MCM-TF products, however, a drawback of this conventional repair process is that product yield is adversely affected if the number of nets requiring repair exceeds the number of available repair lines on the TSM.

Referring again to FIG. 1, a typical pair of wiring nets 116, 118 is shown. For illustrative purposes, it is assumed that a short circuit exists between wiring nets 116, 118. The conventional repair process deletes the entire wiring nets 116, 118 by cutting wiring nets 116, 118 at C4 location 120. In this example, wiring nets 116, 118 are cut (also called deletes) at sites 122, 124, 126, 128, 130, 132, 134, 136, 138, 140, 142, 144, 146, and 148. The deleted wiring nets 116, 118 must be replaced using the TSM repair net (shown in FIG. 2A). FIGS. 2A and 2B shows a typical TSM repair net 200 for the MCM of FIG. 1. In FIG. 2A, repair net 200 is made up of x-lines 202 and y-lines 204. As shown in FIG. 2B, within the gridwork of repair net 200 are C4 connections 206 for each chip 102, 104, 106, 108, 110, 112, and 114 mounted on MCM 100.

FIG. 2C shows an x-ray view of a five-layer MCM and FIG. 2D is a partial side view of MCM 100 illustrating the layered structure of MCM 100. In FIG. 2C, successive layers form MCM 100. Typical layers include ground layer 208, power layer 210, x-layer 212, and y-layer 214. An additional layer, top layer 216 (shown in FIG. 2D), contains repair net 200 and C4 connections 206. It is apparent from FIG. 2C that repair of an internal short circuit between any two x-layer lines or y-layer lines is a formidable task. For this reason, conventional repair processes deleted defective nets at the top layer 216.

Conventionally, repair and inspection of MCMs with thin-films are based on the physical layout of the device. The lines and vias in a particular metal layer are inspected with an automatic tool, such as "Orbot" TF501 manufactured by Orbotech, Inc. of Billerica, Mass. Once a metal bridge between lines is detected, a short is identified by the tool. The operator verifies the short and, if confirmed, the part is sent for repair of the short. A similar procedure applies to opens, where a line is discontinuous due to missing metal.

The conventional method treats all nets equally regardless of net functionality. For example, top-to-bottom input/output (I/O) or timing critical nets (which are repairable in-line only) require priority over other types of nets. If a top-to-bottom I/O net is not repaired in-line the thin-film device will be lost because ATF repair of this type of net is not possible. Therefore, there is a need to prioritize nets, such as top-to-bottom I/O nets over other types of nets.

Furthermore, more than one defective net is normally found during in-line testing. FIG. 2G shows a typical plan view of the X layer 212 and Y layer 214 of MCM 100 as seen by the automated open/short inspection tool. Five (5) individual nets, 242, 244, 246, 248 & 250 show opens 252 adjacent to one another. The open repair process, of ultrasonically bonding a gold slug to bridge the open, has spacing limitations that do not allow opens on adjacent lines to both be repaired. As a result, determining which defective nets to repair in-line versus ATF is necessary to avoid low yields due to an unroutable net.

As mentioned above, conventional ATF repair is based on full repair. That is, the entire internal structure of a defective net is removed at its C4 connections 206. An entirely new set of wiring is reconstructed using repair net 200 and connected to the C4 connections 206 on the TSM. These full repairs are necessary because frequently the location of the defect in the defective net is unclear and the construction of a new net is the only practical way to repair the defective net.

FIG. 2E illustrates a portion of a typical MCM before repair. In FIG. 2E, C4 connection 206 is connected to internal net 220 at via 238. X repair line 222 and Y repair lines 224, 226 are part of the top layer 216. Y repair lines 224, 226 are connected by Y repair line subway 236 using vias 228, 240.

The reconstruction of the net is normally accomplished by joining the segments of the repair lines with individual gold slugs bonded to the TSM of the repair through conventional ultrasonic bonding processes. The gold slugs interconnect specific X and Y repair line segments to rebuild the net topography.

FIG. 2F illustrates the conventional repair process mentioned above. In FIG. 2F, when a short is found in internal net 220 it is completely disconnected from the circuit using external delete 230 between C4 connection 206 and via 238. This process is repeated at every other C4 connection location for internal net 220. To replace this deleted net, a portion of X repair line 222 and Y repair lines 224, 226 must be used. Conventionally, X repair line 222 and Y repair lines 224, 226 are cut using deletes 232. Then C4 connection 206 is connected to X repair line 222 and Y repair line 224 using gold slugs 234.

The drawback of this approach is that a relatively large number of repair lines are consumed for nets with multiple segments. As illustrated in FIG. 2F, an X repair line and a Y repair line were necessary to replace internal net 220. This results in fewer nets being repairable. An additional drawback of this conventional repair process, as mentioned above, is the scrapping of a part if an I/O net is identified as defective. This is because conventional repair processes do not prioritize I/O nets over other types of nets. A further drawback is due to complexity and density of the nets. Conventional techniques cannot accurately determine where the defect is within the MCM without a graphical assistance solution.

Furthermore, because most defective nets run in the same general direction on the device, they require the use of the same top-surface repair lines. In such a case a part might be lost due to unroutability—insufficient repair lines to meet the repair requirements.

Finally, in-line repair is not functionality related. That is, if an in-line open is too long to be bridged by a repair slug, a short is too long to be laser deleted, or a defect is located in a congested area, the part cannot be repaired and is lost.

In view of the shortcomings of the prior art, a new method that assists inspection and repair to identify the nature of a defective net and offer repair selectability based on functionality is needed for enhancement of yield of thin-film products.

SUMMARY OF THE INVENTION

To solve the aforementioned disadvantages of conventional MCM TF repair methods, the present invention relates to a process for graphically assisting the partial repair of defective MCM TF wiring nets. The process comprises the steps of inserting the wiring layer of the thin-film device in a tester, scanning the wiring layer of the thin-film device with the tester, identifying defects in the wiring nets, prioritizing the defects based on a function of each of the defective wiring nets, and repairing the defects based on priority.

The present invention further relates to inserting the thin-film device in a tester, scanning the surface of the thin-film device to locate a short circuit in the wiring nets of the device, and displaying the short circuit to the user. After the short circuit is located, a site to cut (delete site) is identified based on the probability that the nets are shorted in a particular area in the device. This process is continued until all short circuits are identified. The site locations are stored for use by a router which determines whether the repair nets on the TSM are sufficient to repair the device. The router then selects the portion of the repair nets necessary to repair the wiring nets identified for cutting based on timing considerations of each of the nets. The cut nets are then repaired based on the information provided by the router.

The present invention further relates to a method for partially repairing defective MCM TF wiring nets by determining locations where internal cuts (deletes) may be made in only one of the two shorted nets so that it is not necessary to repair the second net.

The present invention finally relates to a process for graphically assisting the repair of a thin-film device comprising the steps of inserting the thin-film device in a tester, the tester containing a configuration of the thin-film wiring nets; locating a short circuit between any two of the wiring nets; displaying a graphical representation of the two wiring nets to an operator; identifying a site to cut in order to eliminate the short circuit; inputting an operator selection to select the identified site; storing repair information based on the operator selection; providing the stored repair information to a router for selecting at least a portion of the repair nets to repair the identified short circuits; determining whether the repair nets are sufficient to repair the thin-film device; repairing the thin-film device in accordance with the selected repair nets; and retesting the repaired thin-film device to determine whether further shorts exist.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIG. 1 is a plan view of a typical MCM;

DETAILED DESCRIPTION OF THE INVENTION

Figure 2A:
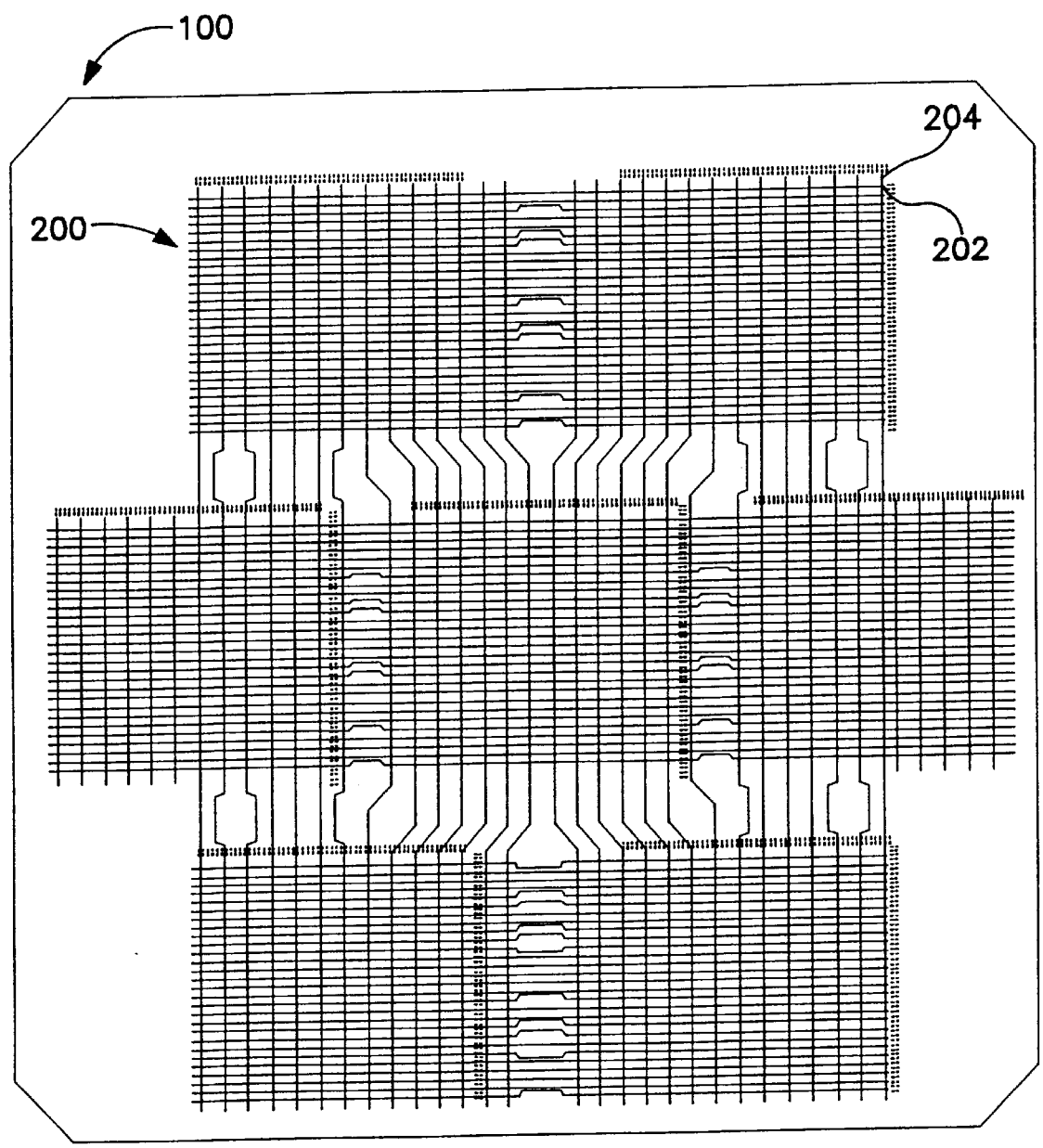
FIG. 2A is a plan view of a typical TSM repair net for the MCM of FIG. 1.
Figure 2B:
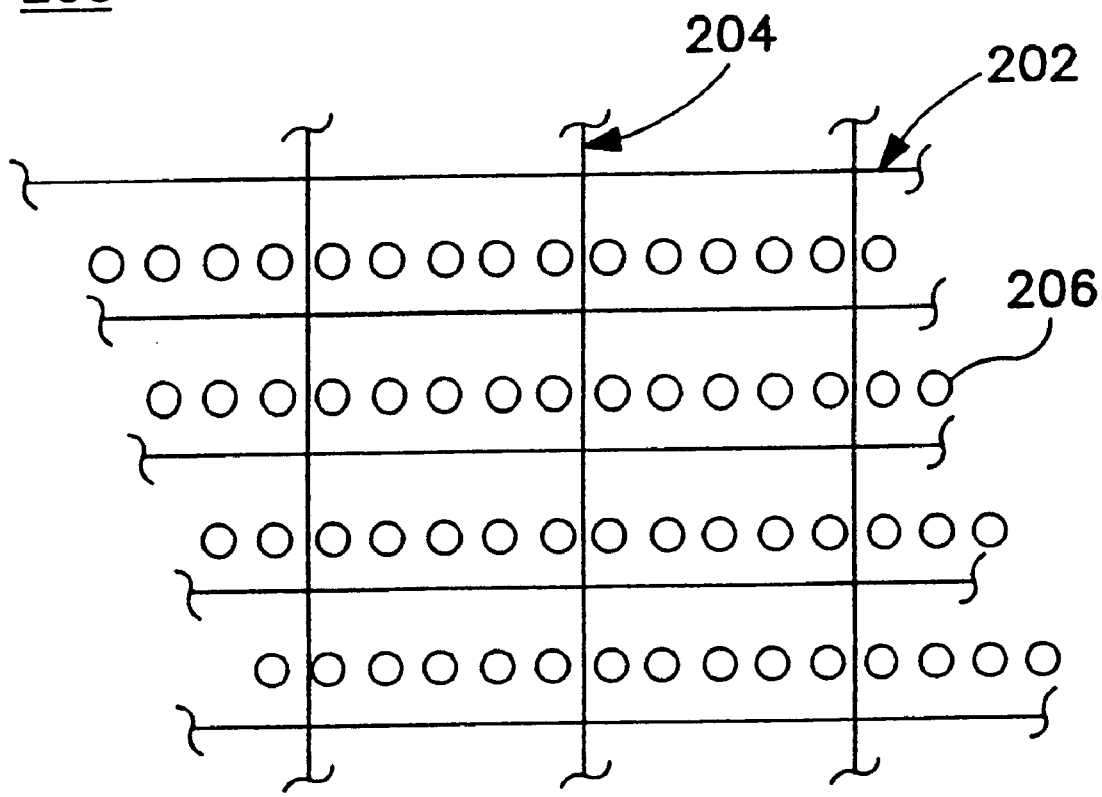
FIG. 2B is a detailed view of a portion of the repair net of FIG. 2A.
Figure 2C:
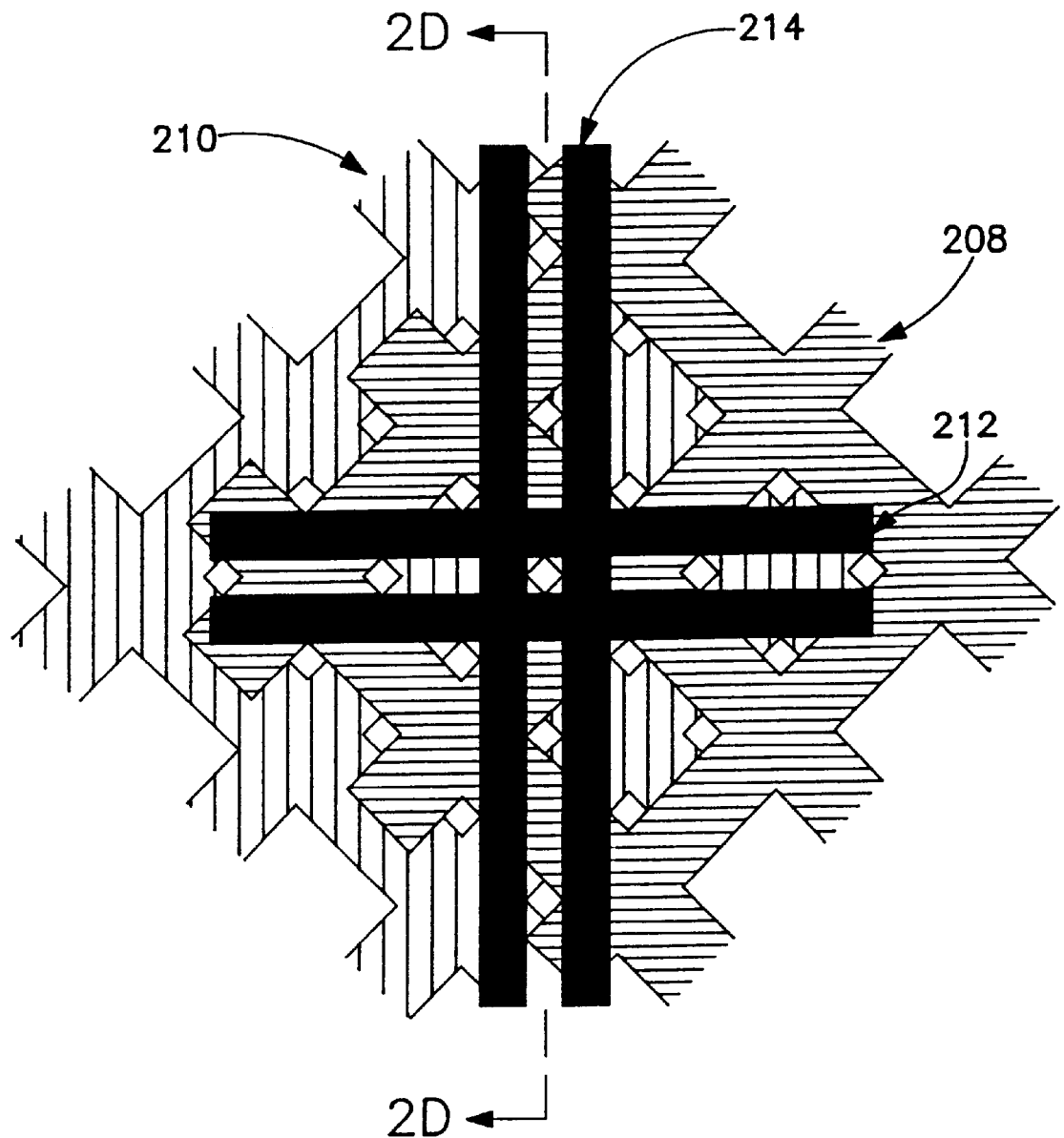
FIG. 2C is an x-ray view of a portion of the MCM of FIG. 2A.
Figure 2D:
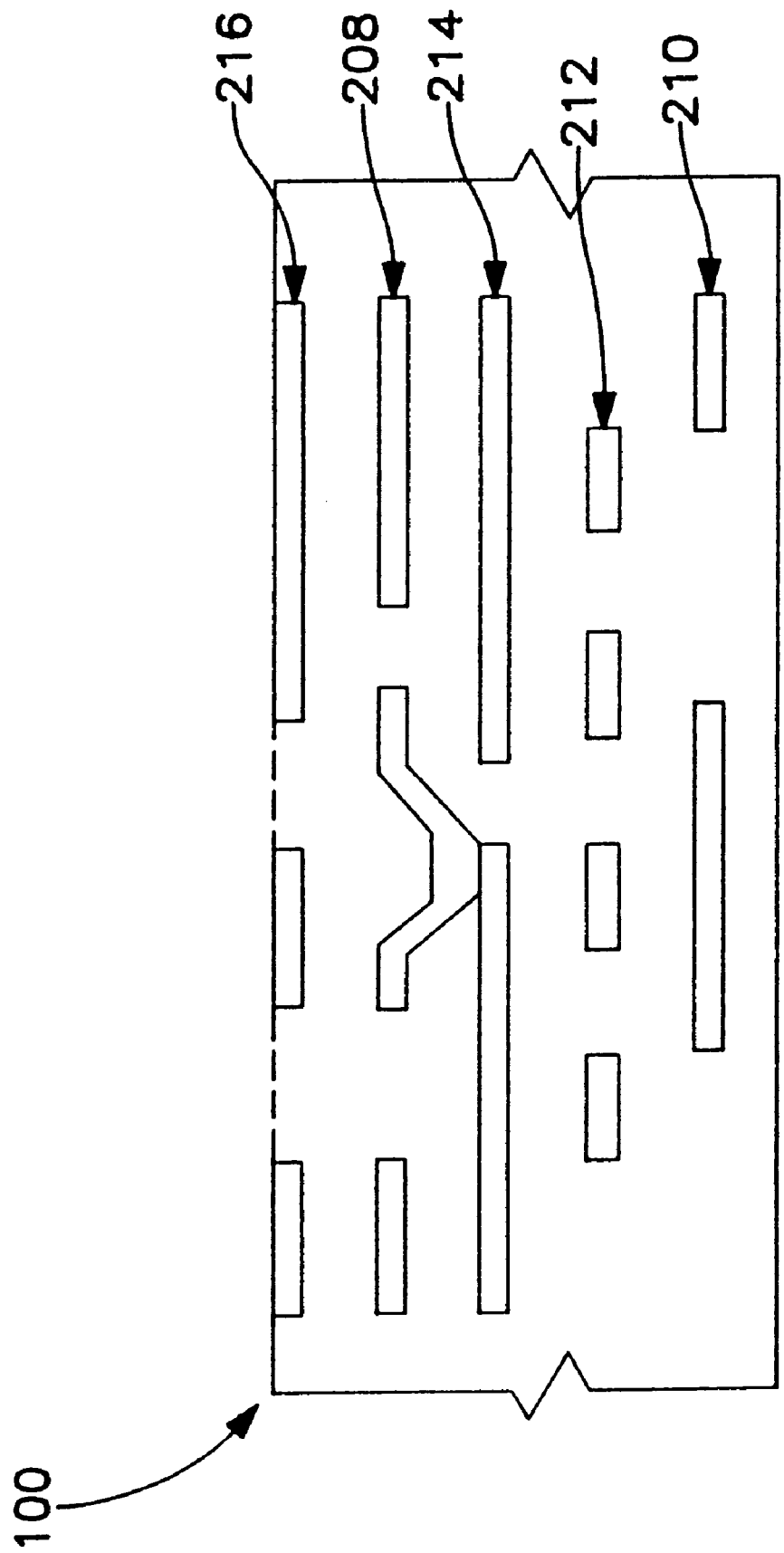
FIG. 2D is a cross-sectional view of FIG. 2C taken along the line 2D—2D.
Figure 2E:
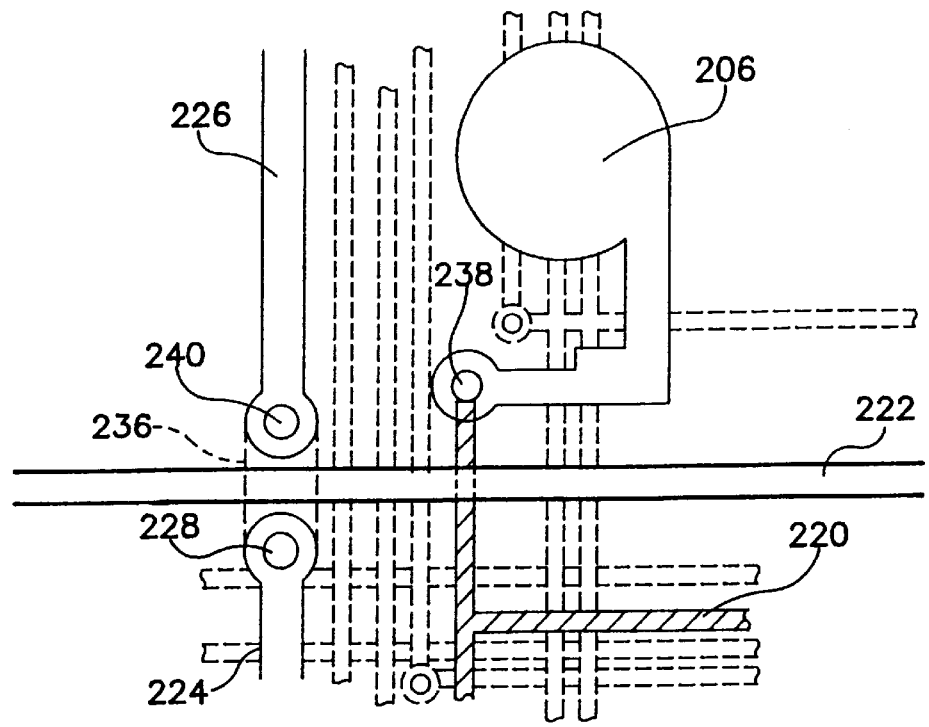
FIG. 2E is a detailed plan view of a portion of the repair net of FIG. 2A prior to repair.
Figure 2F:
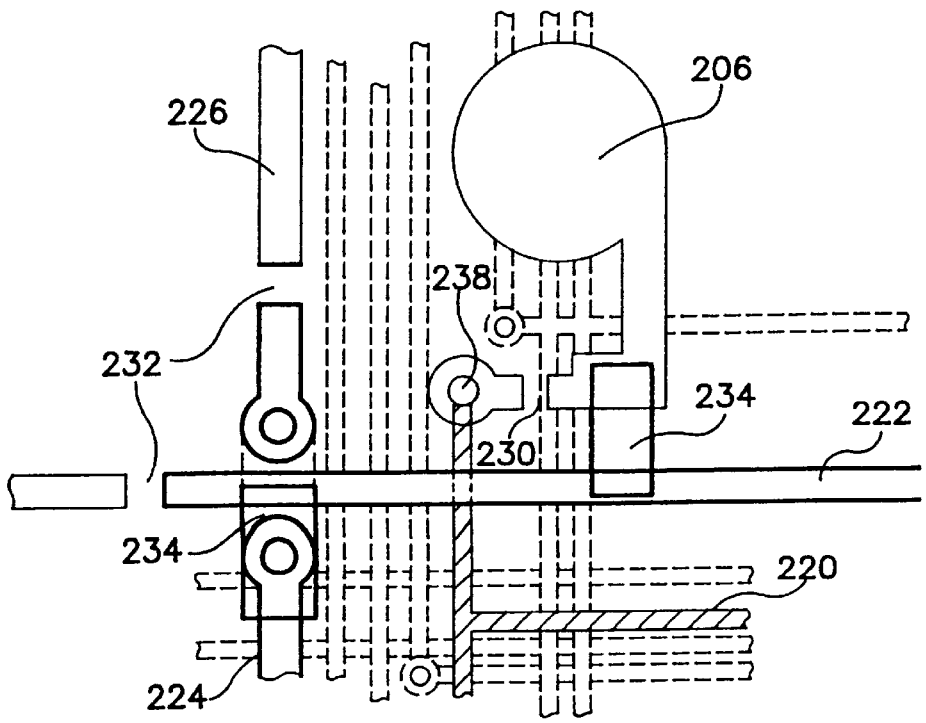
FIG. 2F is a detailed plan view of a portion of the repair net of FIG. 2A detailing the repair structure layout.
Figure 2G:
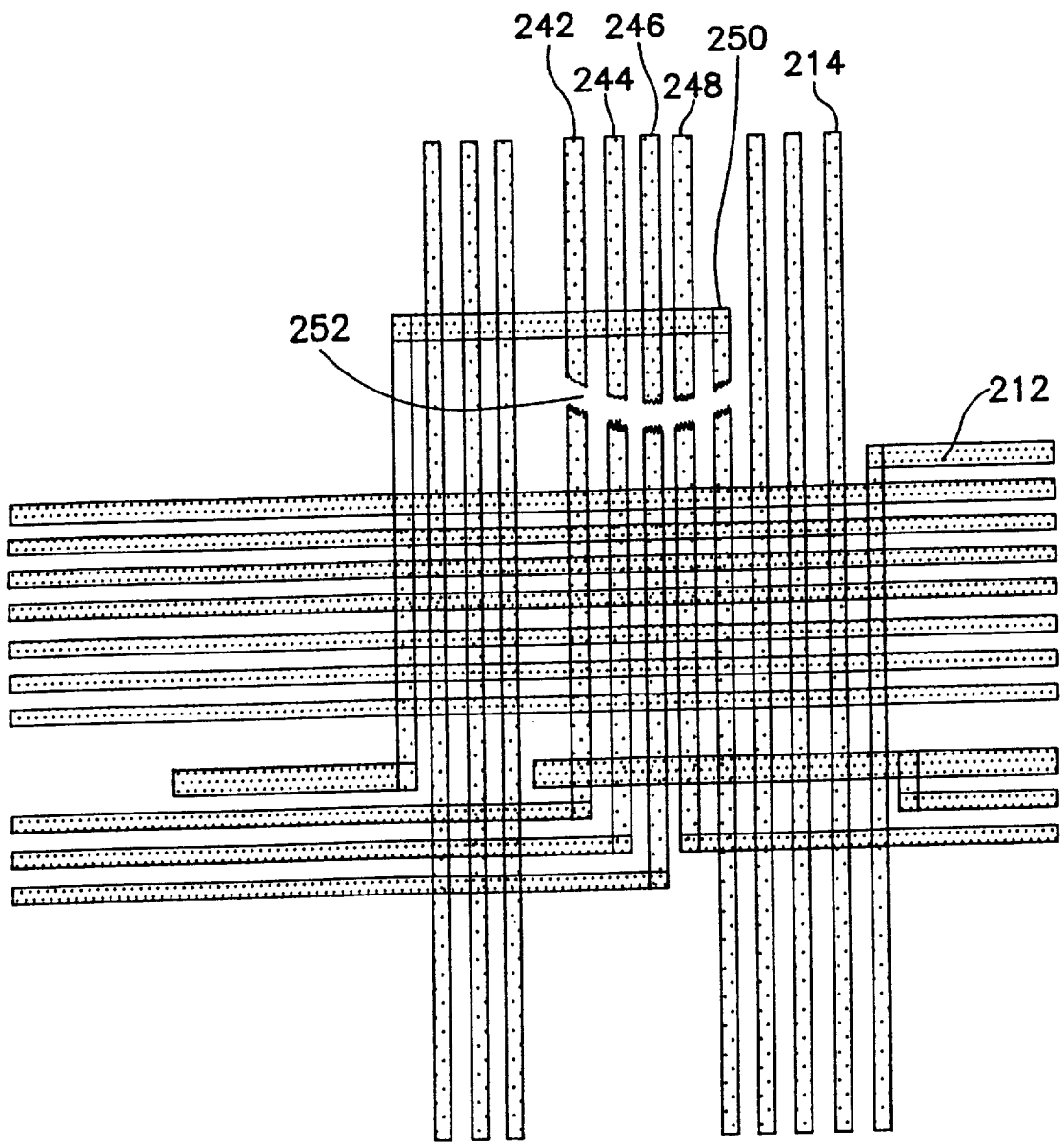
FIG. 2G is a detailed plan view of a portion of the MCM of FIG. 2A at an in process inspection operation.
Figure 3:
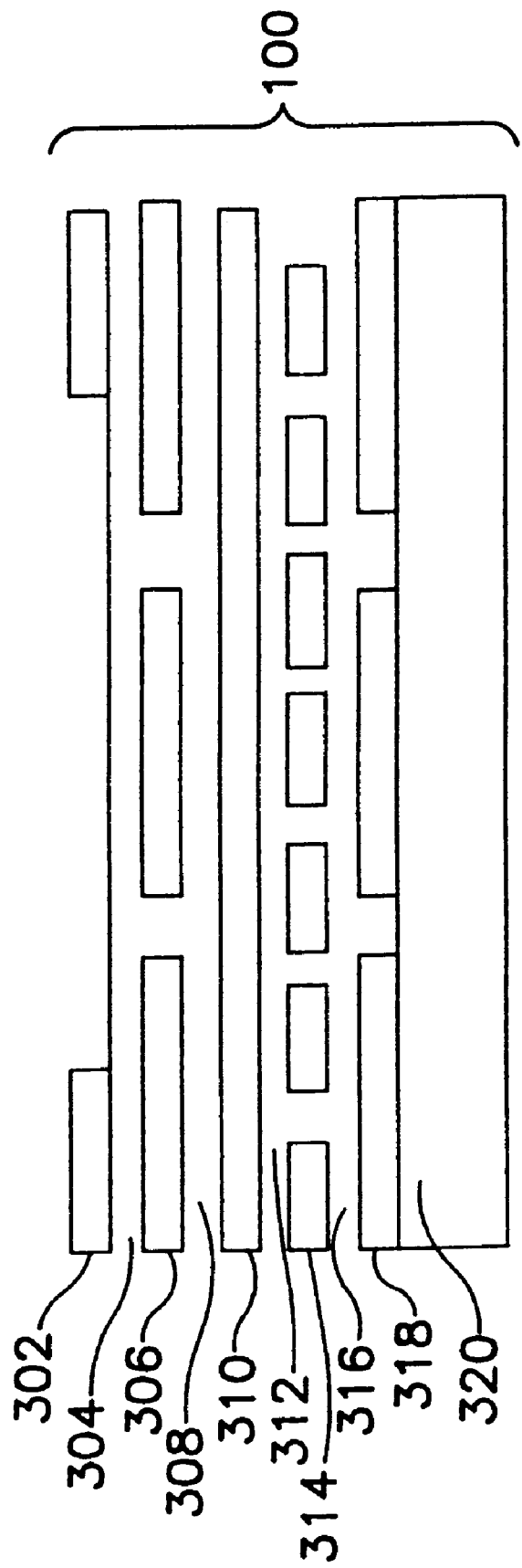
FIG. 3 is a cross-sectional view of an MCM before application of the process of repairing the MCM.

Referring now to the drawing, FIG. 3 is a cross-sectional view of a typical MCM layered structure. In FIG. 3, layers are successively formed to fabricate MCM 100 over substrate 320, such as a ceramic carrier, in the following order: power mesh layer 318, fourth polyimide layer 316, x-line layer 314, third polyimide layer 312, y-line layer 310, second polyimide layer 308, ground mesh layer 306, first polyimide layer 304, and TSM layer 302. It is understood that this arrangement of layers is exemplary and may be in any other order or may include additional layers depending on design requirements of the MCM.

As mentioned above, traditional repair methods treat all nets equally regardless of net functionality, resulting in lower production yields. Therefore, the layout of each net must be identified graphically to guide selective repair and thereby increase production yield.

In an exemplary embodiment of the present invention, a graphics assisted manufacturing method for repair and inspection for MCM TF devices is detailed.

Figure 4:
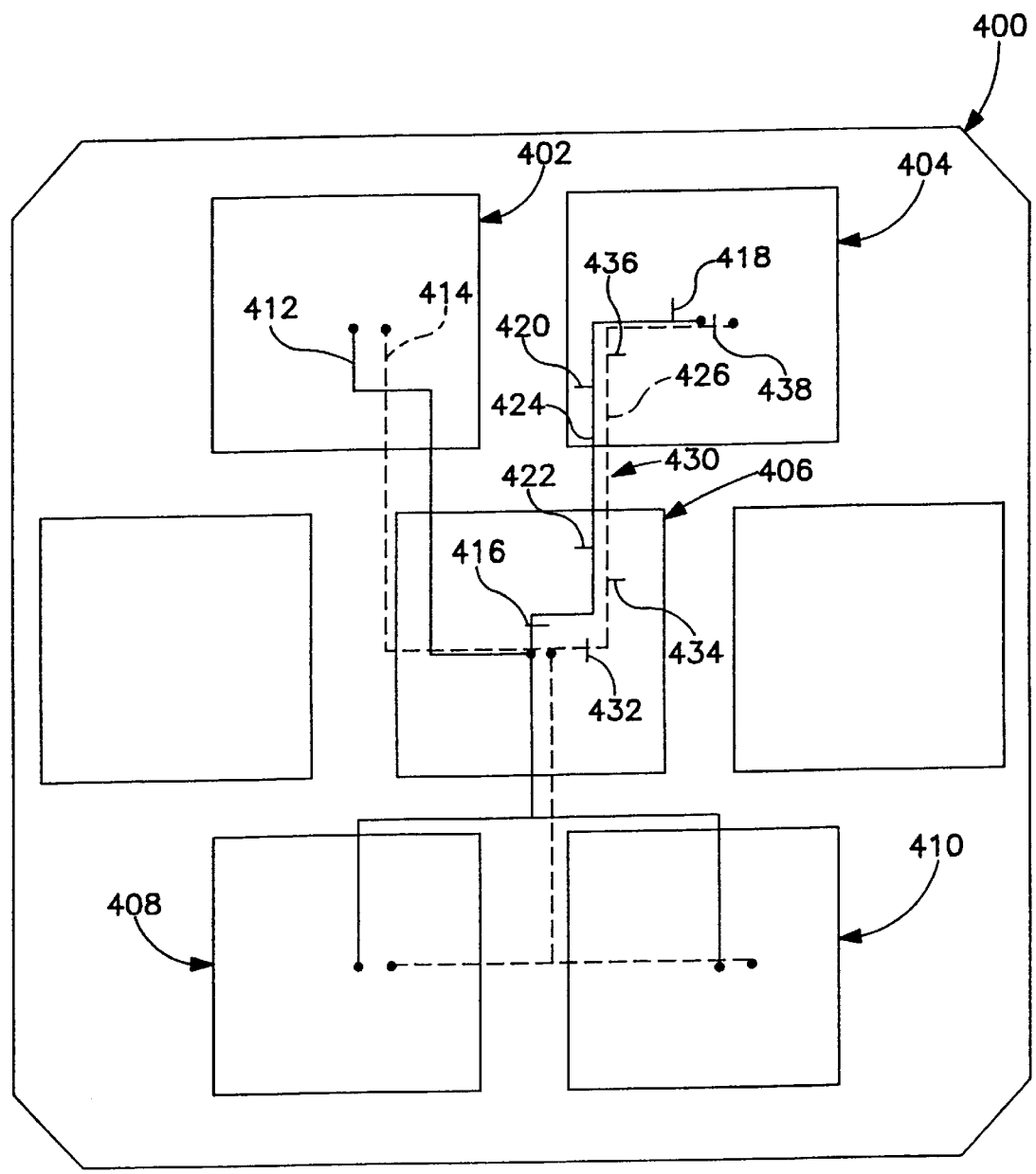
FIG. 4 shows a portion of a graphical representation of an exemplary embodiment of the present invention.

Referring to FIG. 4, a portion of a graphics representation of the detailed physical layout of MCM TF device 400 is displayed. The representation can be created as the MCM TF device 400 is scanned by an inspection tool (not shown). The scanned MCM TF device is then displayed. In this manner, the reparability of a defect along with its impact with respect to the functionality of the device are evaluated in real time. The advanced functionality information in the graphics display permits application of special repair procedures, such as partial repair and in-line (versus ATF) repair, and renders feasible evaluation of open/short trade-offs and open/short repairs previously considered impractical. The detailed design data and the corresponding electrical functionality information of the MCM TF device 400 reside in a host machine (not shown). The host data are used to process masks for manufacturing, electrical functionality evaluation, and module level testing, for example. The amount of data required for an MCM TF device requires that the host machine have a large storage capacity.

Most inspection and test/repair operations, however, are performed on a local area server with each tool controlled by a PC. Therefore, the design data must be compressed to a level suitable for use by a PC. An exemplary compression scheme (not shown) groups design data according to net name and location and where the net changes its direction such as at vias and wire points. In this format, all net information can be contained in files smaller than 10 megabytes, for example. These files may be further reduced to a binary file for input to the PC.

In the exemplary embodiment, when MCM TF device 400 is scanned, a number of graphics capabilities are available to the user, such as zooming (in and out), moving (left, right, up, down), layer grouping (metal levels, repair lines, power/ground meshes), and translation information (X-Y absolute and relative, locating C4 and X-Y positions) of the scanned device. During scanning, the basic layout of the MCM TF device 400 is displayed, including chip site C4 arrangements (not shown), capacitor sites (not shown), alignment marks (not shown) and seal band area (not shown), for example. The operator has the option to view power/ground, C4, repair lines and wiring layers, for example. In conjunction with the basic display features discussed above, each layer of MCM TF device 400 can be examined if desired.

Furthermore, the tester can view each specific net, a group of nets, C4 site, at least one repair line, or at least one wiring layer, for example, in a variety of ways such as:

1) Adding a View: The operator selects the net, or nets, of interest from a master listing and displays them together for structural comparison. Each net may be displayed in a different color automatically, permitting differentiation of the nets.

2) Add an Open Circuit: The operator can specify that a net has an open in a specific segment of the net. The open segment may be displayed in a broken color, for example, to provide a visual aid to the operator.

3) Add a Short Circuit: The group of nets are displayed together as a unit. The two closest parallel segments in each pair of nets may be displayed in broken colors, for example, to highlight to the operator the location of potential short circuits.

Defective nets are automatically arranged into open and shorted groups. Referring to FIG. 4, an example of a short group 430 is shown. All defective segments may be displayed to distinguish these defective segments from other segments as well as from the background of the display. This may be accomplished using a variety of colors or different line attributes, such as dashed or hatched lines. The open segments (not shown) are read directly from the test data.

The basic premise of partial repair is that the location of a defect in a net can be identified. This premise was established based on extensive failure analysis and diagnostic data. The short circuit location is based on the nearest channels concept and is based on diagnostic data which show that a short between two nets is likely to occur, with over 95% certainty, in an area where the two nets are running in parallel, such as one channel apart.

Referring again to FIG. 4, a short between nets 412 and 414, connected between chips 402, 404, 406, 408, and 410, is most likely to occur between segments 424 and 426. There is also an over 99% certainty that a defective net has only one defect per net. The tester display then searches the data base containing the net information of the device under test for any pair of segments in the shorting nets for the nearest parallel channels. Once the net information is located, the entire segment may be highlighted, as mentioned above, to aid visual identification. In this case, segments 424 and 426 are highlighted to the operator as the potential site of the short circuit.

The operator can also by-pass the auto loading feature to input the open circuit and short circuit information manually. This is helpful when several sets of test data must be merged together for a complete data analysis. The operator can select a net on the display and the tester will provide, for example, the net name, reparability status, C4 location, I/O location, segment length, etc. This information is crucial in determining a partial repair.

The tester only saves the defective nets for repair and test, which provides a way to personalize the autorouting file for each defective device. In addition to providing defective net information, the tester also identifies defective segments in the nets for the repair file. This is a critical feature which provides partial repair of the MCM.

The tester automatically matches the defective segment to the repair list and selects the appropriate portion of the repair file which matches the defective segment of the net. Because only a portion of a net is recorded, the auto-router routes only the defective segment to accomplish partial repair of the nets.

To complete the partial repair, an internal delete is required to permit the deletion of the defective segment from the main net. Referring again to FIG. 4, possible internal deletes 416, 418, 420, 422, 432, 434, 436 and 438 are shown to eliminate a short circuit between segments 424 and 426 (short group 430) of nets 412 and 414, respectively. These deletes are location dependent based on the physical layout of the MCM. The number of deletes shown is illustrative and not all of the deletes are necessary to eliminate the short circuit. The operator will trace the net using the various display features to locate a position where an internal delete is possible. The delete information (not shown), such as X-Y position, delete orientation, delete z-level, and the like, is then saved for use by the repair tool. In this example, only one of internal deletes 416, 418, 420, 422, 432, 434, 436 and 438 is necessary to eliminate the short circuit. More than one delete may be necessary, however, to prevent undesirable effects, such as antenna effect, which may result if the deleted portion of the defective net which remains attached to the non-repaired net is too long. The repair data are then provided to the repair tool to guide the tool to the delete sites and perform the required deletes.

The exemplary tester may be connected to other work stations, such as the repair tool, via a LAN connection, for example, for data retrieval, data forwarding, and data integration.

Figure 5:
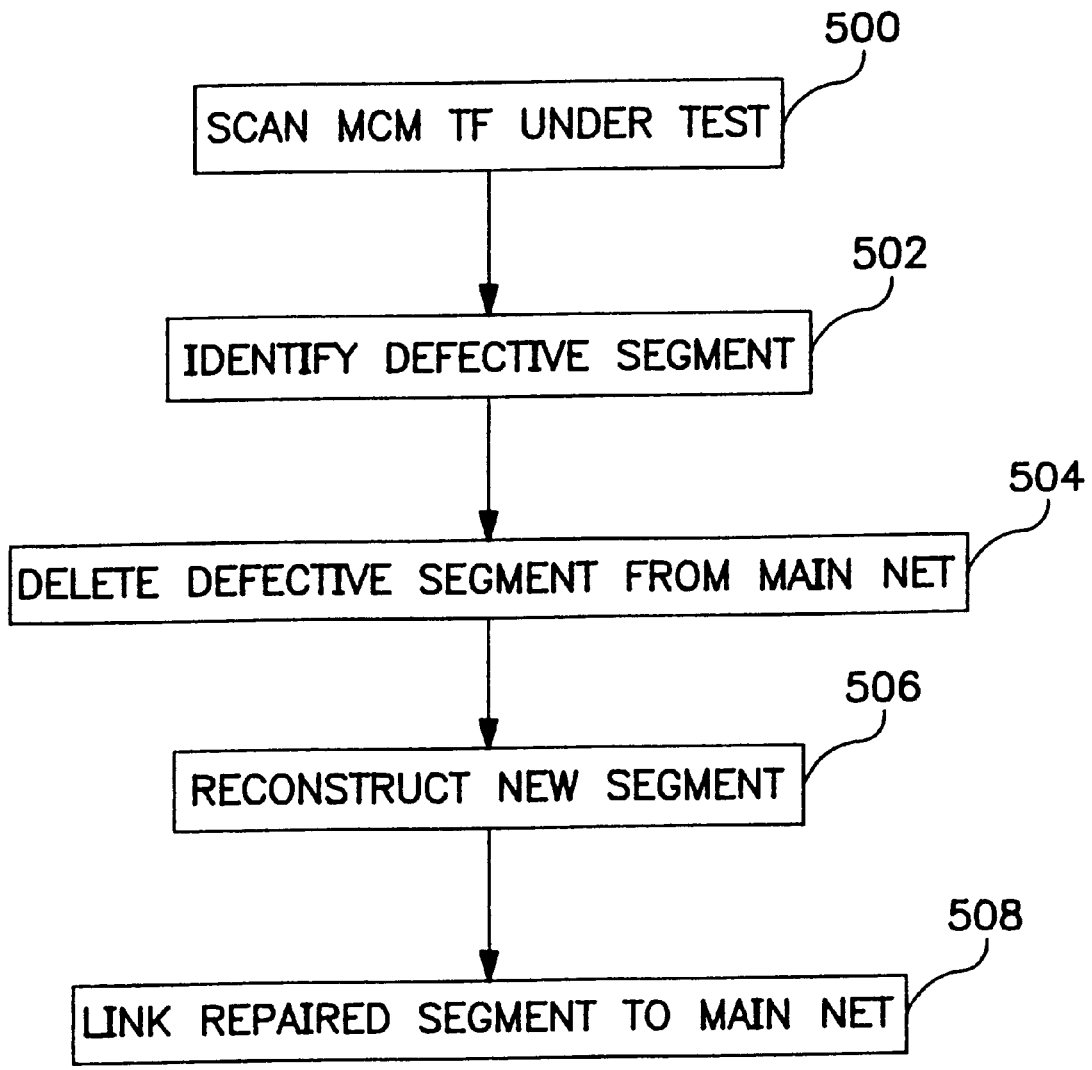
FIG. 5 shows various process steps of an exemplary embodiment of the present invention.

Referring to FIG. 5, the partial repair method of an exemplary embodiment of the present invention is illustrated. In FIG. 5, Step 500 scans the MCM TF device under test, Step 502 identifies a defective segment, Step 504 deletes the defective segment from the main net, Step 506 reconstructs a new segment to replace the deleted segment using existing top-surface repair lines, and Step 508 links the repaired segment to the main net.

Figure 6A:
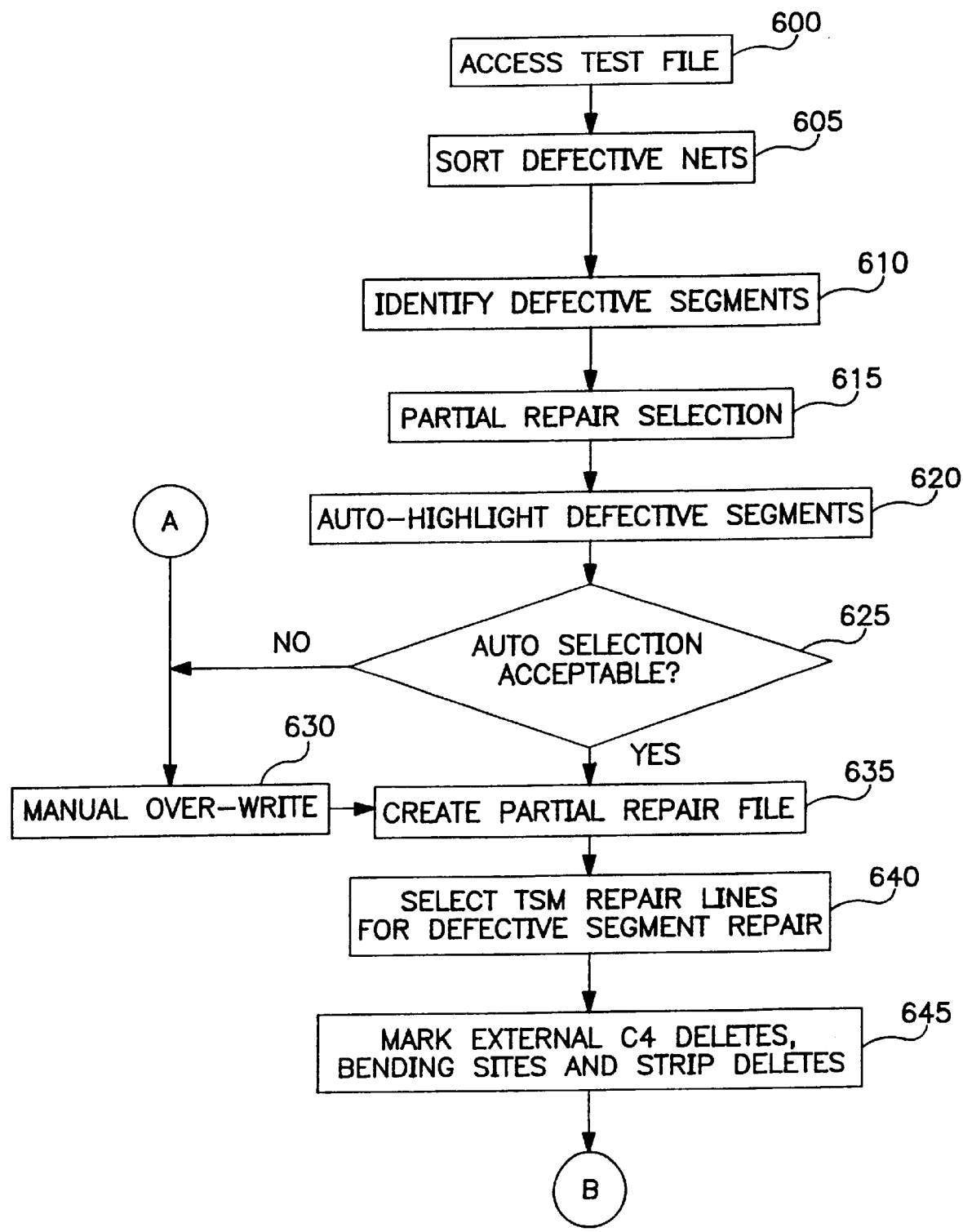
FIGS. 6A and 6B show various process steps of another exemplary embodiment of the present invention.
Figure 6B:
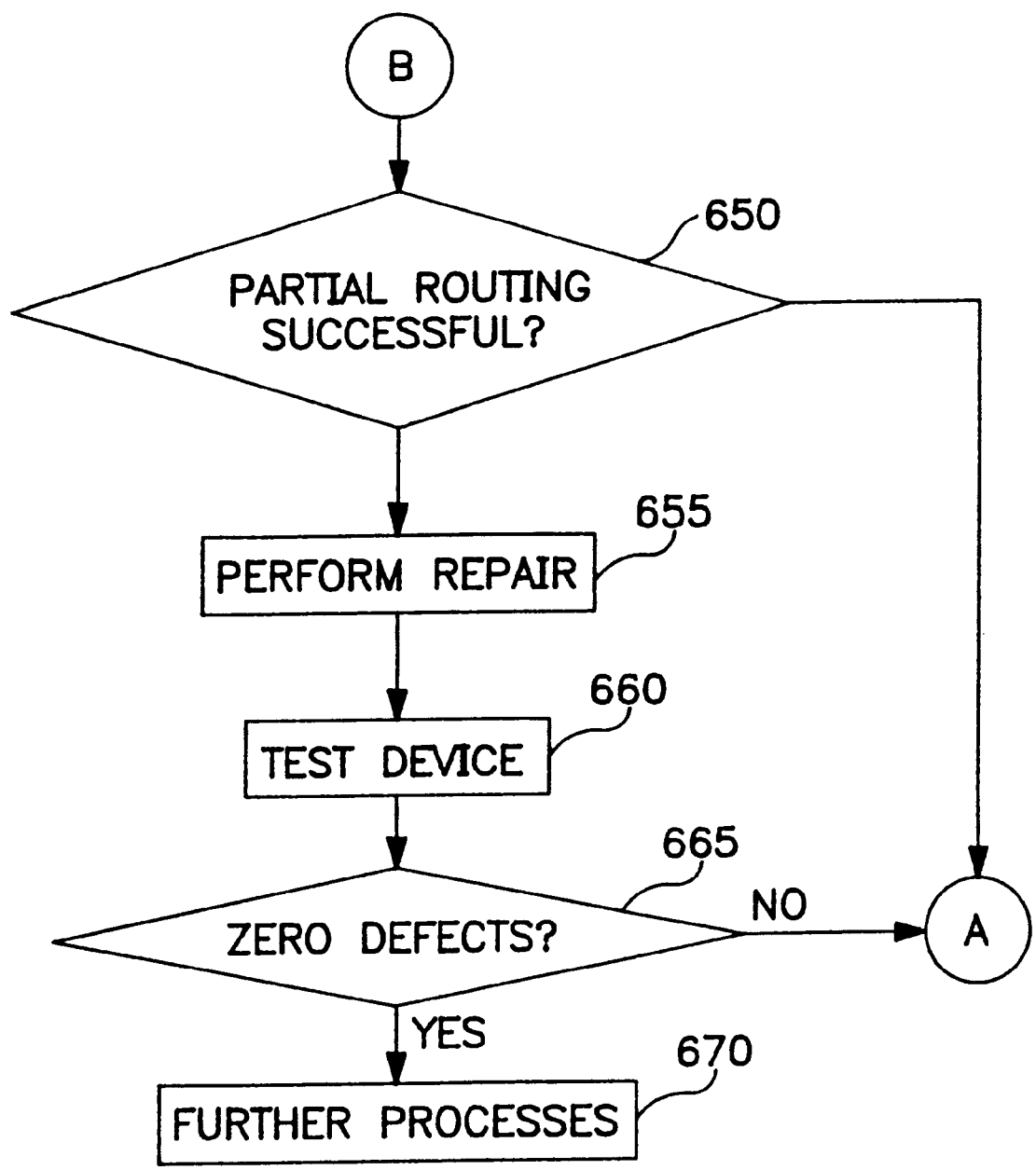

Referring to FIGS. 6A and 6B, a partial repair method of another exemplary embodiment of the present invention is illustrated. In FIG. 6A, at Step 600 a test file containing net information of the thin-film device under test is accessed. This test file may be resident or loaded into the tester via media or a communications port such as a network. At Step 605, the defective nets are determined and sorted. Defective net sorting is based on certain criteria, such as net functionality (such as I/O, internal net function, internal/external net function, external net function), open defects, short defects, etc. At Step 610, the defective segments of the shorted or open nets are identified. At Step 615, partial repair selections are made by the tester. As mentioned above, for a short between a pair of nets, for example, partial repair selection repairs only one defective net.

At Step 620, the defective segments are graphically represented and highlighted to the operator. At Step 625, the operator determines whether the automatic selections made by the tester are acceptable. If any selection is not acceptable, at Step 630 the operator may over-write the selection with another selection. If the auto selection is acceptable or after the manual over-write, Step 635 is executed. The auto-select function of the tester may be disabled, in which case Step 620 presents a graphical representation of the device to the operator and does not auto-select defective nets. In addition, Step 625 is eliminated and only operator input at Step 630 is accepted.

At Step 635, a partial repair file is created by the tester. As mentioned above, the partial repair file contains only the information necessary to repair a segment of a defective net. The repair information may be stored on media if desired for use by the repair tool or may be directly communicated to the repair tool using a network, such as a LAN. At Step 640, TSM repair lines are selected to repair the defective segments identified. At Step 645, sites are marked for deletion.

Turning to FIG. 6B, at Step 650, it is determined if the partial routing is successful. If not, a manual over-write at Step 630 is executed to reselect an alternative segment of the defective net. If the partial routing was successful, Step 655 is entered in which the device is repaired based on the repair information created in Step 635 using partial repair deletes (internal and external, as required), bonding, etc. At Step 660, the device is tested once again. At Step 665, it is determined if additional defects exist. If defects still exist, Step 630 is executed allowing the operator to select a defective segment for repair. If additional defects are not detected, the device is removed from the tester at Step 670 and sent on to further manufacturing processes, such as component mounting.

As stated earlier, partial repairs use about half of the repair lines. Therefore, by using a partial repair procedure, more defective nets may be repaired.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A process for repairing a wiring layer of a thin-film device having a plurality of nets, the process comprising the steps of:
   (a) inserting the wiring layer of the thin-film device in a tester,
   (b) scanning the wiring layer of the thin-film device with the tester,
   (c) identifying defects in at least one net of the plurality of nets,
   (d) prioritizing the defects based on a function of each of the plurality of nets, and
   (e) repairing only a portion of the at least one net of the plurality of nets identified in step (c) based on the prioritizing of step (d), wherein a remaining portion of the at least one net remains intact.

2. A process for repairing a wiring layer of a thin-film device having a plurality of nets, the process comprising the steps of:
   (a) inserting the wiring layer of the thin-film device in a tester,
   (b) scanning the wiring layer of the thin-film device with the tester,
   (c) inputting data representing the plurality of nets of the thin-film device to the tester,
   (d) displaying the plurality of nets based on the data on a display of the tester,
   (e) identifying a defect in the wiring layer,
   (f) overlaying the defect on the display of the plurality of nets,
   (g) prioritizing the defect, and
   (h) determining repair site information to repair only a portion of at least one net of the plurality of nets for the defect identified in step (e) based on the prioritizing of step (g), wherein the repair of only the portion of the net eliminates the defect in the net.

3. The process according to claim 2, wherein the defect identified in step (e) is one of a short circuit and an open circuit located in at least a portion of at least one of the plurality of nets.

4. The process according to claim 2, further comprising the steps of:
   (i) storing the repair site information determined in step (h),
   (j) inserting the layer of the thin-film device in a repair tool,
   (k) providing the stored repair site information to the repair tool, and
   (l) repairing the defect based on the stored repair site information.

5. The process according to claim 4, wherein the stored information is provided to the repair tool via a network.

6. The process according to claim 2, wherein the defect is prioritized based on a functionality of a respective one of the plurality of nets.

7. The process according to claim 6, wherein the functionality is one of i) an input/output (I/O) function, ii) an internal net function, iii) an internal/external net function, and iv) an external net function.

8. The process according to claim 2, wherein the repair site information is at least one of an internal delete, an external delete, a wiring bridge, and a replacement wiring segment.

9. A process for graphically assisting the repair of a thin-film device having a plurality of nets, the process comprising the steps of:

(a) inserting the thin-film device in a tester, the tester containing a configuration of the plurality of nets, (b) locating a short circuit between any two nets of the plurality of nets, (c) displaying a graphical representation of the two nets located in step (b) to an operator, (d) identifying to the operator a site to cut in order to eliminate the short circuit, (e) inputting a selection from the operator to select the identified site, (f) storing repair information based on the operator selection, (g) repeating steps (b) through (f) until all short circuits are located, (h) providing the stored repair information to a router for selecting at least a portion of repair nets located within the thin-film device to repair all of the short circuits identified, (i) determining whether the repair nets are sufficient to repair the thin-film device, (j) repairing the thin-film device in accordance with the selected repair nets, (k) retesting the repaired thin-film device to determine whether further shorts exist, and (l) repeating steps (c) through (k) until no short circuits are identified.

10. The process according to claim 9, wherein step (c) allows the operator to at least one of:

i) zoom, ii) rotatably translate, iii) laterally move, and iv) transversely move the graphical display of the thin-film device.

11. The process according to claim 9, wherein step (c) allows the operator to view at least one of:

i) a controlled collapse chip connection (C4) site, ii) at least one repair line, and iii) at least one wiring layer.

12. The process according to claim 9, wherein step (c) displays each net of the plurality of nets in a different color.

13. The process according to claim 9, wherein step (c) displays the two identified nets in a different color.

14. The process according to claim 9, wherein step (c) further comprising the steps of:

(c1) listing the plurality of nets within the thin-film device on the display, and (c2) selecting at least one of the nets for graphical display based on an operator input.

15. The process according to claim 14, further comprising the step (c3) of displaying at least one of i) a net identification, ii) a reparability status, iii) a C4 location, iv) an input/output (I/O) location, and v) a net segment length of the selected net.

16. The process according to claim 9, wherein the repair information is stored on a recording medium.

17. The process according to claim 9, wherein the stored repair information is provided to the router via a network.

18. The process according to claim 9, wherein the site identified in step (d) is based upon a probability that the short circuit is between respective parallel portions of the two nets.

19. A process for repairing a wiring layer of a thin-film device having a plurality of nets, the process comprising the steps of:

(a) forming a repair network over a top surface of the thin-film device, (b) inserting the wiring layer of the thin-film device in a tester, (c) scanning the wiring layer of the thin-film device with the tester, (d) displaying the scanned wiring layers, (e) graphically identifying defects in the plurality of nets, (f) prioritizing the defects based on i) a function of each of the plurality of nets and ii) the type of defect, and (g) repairing only a portion of at least one of the plurality nets containing the defects identified in step (c) based on the prioritizing of step (f), wherein a remaining portion of the plurality of nets remains intact.

20. A process for repairing a wiring layer of a thin-film device having a plurality of nets, the process comprising the steps of:

(a) inserting the wiring layer of the thin-film device in a tester, (b) scanning the wiring layer of the thin-film device with the tester, (c) identifying at least one defective portion in at least one of the plurality of nets, (d) prioritizing the defective portion of the plurality of nets based on a function of each of the plurality of nets, and (e) repairing only the defective portion of the plurality at least one of the defects identified in step (c), wherein a remaining portion of the net remains intact.

* * * * *